(12) United States Patent
Engelmann et al.

(10) Patent No.: US 7,183,629 B2
(45) Date of Patent: Feb. 27, 2007

(54) METAL LINE HAVING AN INCREASED RESISTANCE TO ELECTROMIGRATION ALONG AN INTERFACE OF A DIELECTRIC BARRIER LAYER BY IMPLANTING MATERIAL INTO THE METAL LINE

(75) Inventors: Hans-Juergen Engelmann, Dresden (DE); Ehrenfried Zschech, Moritzburg (DE); Peter Huebler, Coswig (DE)

(73) Assignee: Advanced Micro Devices, Inc., Austin, TX (US)

( * ) Notice: Subject to any disclaimer, the term of this patent is extended or adjusted under 35 U.S.C. 154(b) by 301 days.

(21) Appl. No.: 10/813,223

(22) Filed: Mar. 30, 2004

(65) Prior Publication Data
US 2005/0046031 A1    Mar. 3, 2005

(30) Foreign Application Priority Data
Aug. 29, 2003  (DE)  ................. 103 39 990

(51) Int. Cl.
*H01L 21/4763*    (2006.01)

(52) U.S. Cl. ..................................... 257/627; 257/687
(58) Field of Classification Search .................... None
See application file for complete search history.

(56) References Cited

U.S. PATENT DOCUMENTS 6,023,100 A    2/2000   Tao et al. .................... 257/762

FOREIGN PATENT DOCUMENTS

WO    WO 01/08213 A1    2/2001
WO    WO 01/97283 A1    12/2001

*Primary Examiner*—Leonardo Andújar
(74) *Attorney, Agent, or Firm*—Williams, Morgan & Amerson, P.C.

(57) ABSTRACT

During the formation of a metallization layer of a semiconductor device, a cap layer is formed above a metal line and subsequently an implantation process is performed so as to modify the metal in the vicinity of the interface between the cap layer and the metal line. Consequently, an improved behavior in view of electromigration of the metal line may be obtained, thereby increasing device reliability.

12 Claims, 3 Drawing Sheets

METAL LINE HAVING AN INCREASED RESISTANCE TO ELECTROMIGRATION ALONG AN INTERFACE OF A DIELECTRIC BARRIER LAYER BY IMPLANTING MATERIAL INTO THE METAL LINE

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material.

2. Description of the Related Art

In modern integrated circuits, minimum feature sizes, such as the channel length of field effect transistors, have reached the deep sub-micron range, thereby steadily increasing performance of these circuits in terms of speed and/or power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip. In integrated circuits having minimum dimensions of approximately 100 nm and less, a limiting factor of device performance is the signal propagation delay caused by the switching speed of the transistor elements. As the channel length of these transistor elements is less than 100 nm, it turns out, however, that the signal propagation delay is no longer limited by the field effect transistors but is limited, owing to the increased circuit density, by the close proximity of the interconnect lines, since the line-to-line capacitance is increased in combination with a reduced conductivity of the lines due to their reduced cross-sectional area that is caused by the reduced available floor space. The parasitic RC time constants therefore require the introduction of a new type of material for forming the metallization layer.

Traditionally, metallization layers are formed by a dielectric layer stack including, for example, silicon dioxide and/or silicon nitride with aluminum as the typical metal. Since aluminum exhibits significant electromigration at higher current densities than may be necessary in integrated circuits having extremely scaled feature sizes, aluminum is being replaced by copper, which has a significantly lower electrical resistance and a higher resistivity against electromigration.

The introduction of copper, however, entails a plurality of issues to be dealt with. For example, copper may not be deposited in higher amounts in an efficient manner by well-established deposition methods, such as chemical and physical vapor deposition. Moreover, copper may not efficiently be patterned by well-established anisotropic etch processes and therefore the so-called damascene technique is employed in forming metallization layers including copper lines. Typically, in the damascene technique, the dielectric layer is deposited and then patterned with trenches and vias that are subsequently filled with copper by plating methods, such as electroplating or electroless plating.

A further issue with the copper technology is the ability of copper to readily diffuse in silicon dioxide. Therefore, copper diffusion may therefore negatively affect device performance, or may even lead to a complete failure of the device. It is therefore necessary to provide a diffusion barrier layer between the copper surfaces and the neighboring materials to substantially prevent copper from migrating to sensitive device regions. Thereby, the diffusion barrier layer may also serve to improve adhesion and impart enhanced mechanical stability to the structure.

Silicon nitride is known as an effective copper diffusion barrier, and is thus often used as a dielectric barrier material separating a copper surface from an interlayer dielectric, such as silicon dioxide. As previously noted, the device performance of extremely scaled integrated circuits is substantially limited by the parasitic capacitances of adjacent interconnect lines, which may be reduced by decreasing the resistivity thereof and by decreasing the capacitive coupling in that the overall dielectric constant of the dielectric layer is maintained as low as possible. Since silicon nitride has a relatively high dielectric constant k of approximately 7, compared to silicon dioxide (k≈4) or other silicon dioxide based low-k dielectric layers (k<4), frequently, barrier layers on the basis of silicon carbide are used. Moreover, silicon carbide may provide an enhanced interface bonding for low-k materials compared to silicon nitride.

Although copper exhibits superior characteristics with respect to resistance to electromigration compared to, for example, aluminum, the ongoing shrinkage of feature sizes, however, leads to a further reduction of the size of copper lines and thus to increased current densities in these lines, thereby causing a non-acceptable degree of electromigration despite the superior characteristics of copper. Electromigration is a diffusion phenomenon occurring under the influence of an electric field, which leads to a metal diffusion in the direction of the moving charge carriers, thereby finally producing voids in the metal lines that may cause device failure. In the case of copper, it has been confirmed that these voids typically originate at the copper/diffusion barrier interface and represent one of the most dominant diffusion paths in copper metallization structures. It is therefore of great importance to produce high quality interfaces between the copper and the diffusion barrier, such as the silicon nitride layer or the silicon carbide layer, to reduce the electromigration to an acceptable degree.

It turns out, however, that irrespective of the barrier material used, significant electromigration may be observed in modern integrated circuits, wherein this effect is further enhanced in the presence of elevated temperatures, mechanical stress, and the like, which represent typical operating conditions of modern integrated circuits. Thus, a further device scaling may result in a reduced device performance or in a premature device failure owing to increased metal diffusion along the interface between the barrier layer and the metal line.

In view of the problems with respect to electromigration of metals, such as copper, at interfaces to an overlying surface of a barrier layer, an improved technique is required that may eliminate or at least reduce some of the issues identified above.

SUMMARY OF THE INVENTION

Generally, the present invention relates to a technique to effectively reduce the diffusion activity of a metal line at an interface to a dielectric cap layer, thereby significantly reducing the metal's tendency for electromigration during increased current densities within the metal line. To this end, an appropriate material is introduced through the cap layer, or at least a portion thereof, into the metal region in the vicinity of the interface so as to efficiently fill any vacancies and/or block grain boundaries of the metal.

According to one illustrative embodiment of the present invention, a method comprises forming a metal region above a substrate, wherein the metal region comprises a first surface portion and a second surface portion, the latter being located opposite of the first surface portion. Then, a cap layer is formed on the first surface portion and a diffusion hindering or diffusion rate reducing material is implanted into the metal-containing region.

According to still a further illustrative embodiment of the present invention, a semiconductor structure comprises a dielectric layer and a metal region that is formed in the dielectric layer and that has a first surface portion and a second surface portion located oppositely to each other. A dielectric cap layer is formed on the first surface portion of the metal region so as to form an interface therebetween. A concentration of a diffusion hindering or diffusion rate reducing material in the metal region at the first surface portion is higher than at the second surface portion.

BRIEF DESCRIPTION OF THE DRAWINGS

The invention may be understood by reference to the following description taken in conjunction with the accompanying drawings, in which like reference numerals identify like elements, and in which.

Figure 1A:
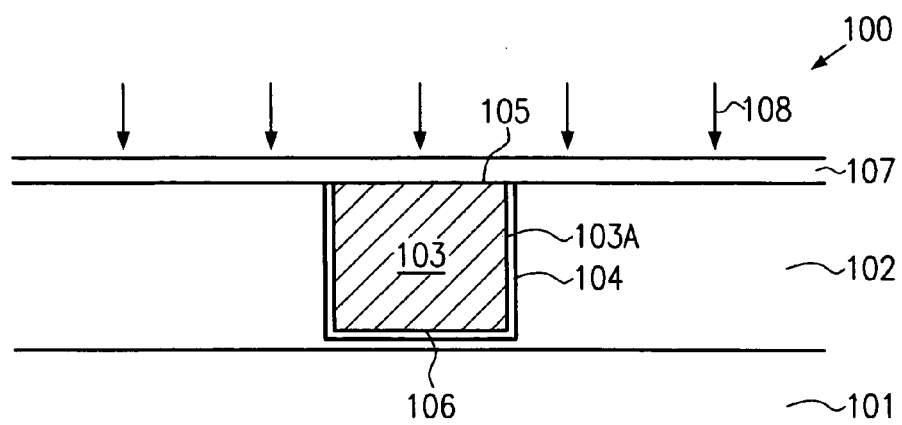
FIGS. 1a–1d schematically show cross-sectional views of a semiconductor device during various stages of forming a metal line and a corresponding cap layer with superior characteristics with respect to electromigration according to illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

It should be noted that the present invention is particularly advantageous for the formation of sophisticated integrated circuits having copper lines in respective metallization layers, wherein lateral dimensions of the metal lines may be on the order of 130 nm or even less, since then the required current densities in these copper lines may result in an increased electromigration of copper, thereby resulting in premature device failure, or in a reduced device performance. Hence, the present invention has the potential for further device scaling of copper-based semiconductor devices, but may also be applied to semiconductor devices of greater lateral dimensions as specified above, thereby contributing to an enhanced reliability of such semiconductor devices. Moreover, the principles of the present invention may also be advantageously applied in combination with other metals considered appropriate for the formation of metal lines in semiconductor devices. For instance, the present invention may be advantageously used with copper alloys, aluminum, and the like. It should therefore be appreciated that the present invention should not be considered as being restricted to any device dimensions and materials unless such restrictions are explicitly referred to in the appended claims.

With reference to FIGS. 1a–1d and 2a–2b, further illustrative embodiments of the present invention will now be described in more detail. In FIG. 1a, a semiconductor device 100 comprises a substrate 101, which may include one or more semiconductor-based circuit elements, such as transistors, resistors, capacitors and the like, wherein the type of semiconductive material provided in or on the substrate 101 may comprise any appropriate semiconductor element or semiconductor compound usable for the production of integrated circuits. Since the vast majority of the integrated circuits are fabricated as silicon-based devices, the substrate 101 may represent a silicon substrate or a silicon-on-insulator (SOI) substrate having formed thereon a plurality of circuit elements that may be connected to each other in conformity with the circuit design by a metal line to be formed. For convenience, corresponding circuit elements are not shown in the substrate 101. A dielectric layer 102, which may be comprised of any appropriate dielectric material, such as silicon dioxide and/or silicon nitride, or a low-k dielectric material, such as SiCOH, and the like is formed above the substrate 101. The dielectric layer 102 contains an opening that is filled with a highly conductive material so as to form a metal region 103 having a first surface portion 105 and a second surface portion 106 that are located opposite to each other.

As previously explained, the metal region 103 may comprise copper, copper alloys, aluminum, aluminum alloys, or any other metal that is considered appropriate for providing the required conductivity of the metal region 103. Preferably, the metal region 103 is substantially comprised of copper, as copper is presently considered the most promising candidate for the formation of highly conductive metallization layers. The metal region sidewall 103A and the second surface portion 106 may be covered by a conductive barrier layer 104 so as to substantially prevent the diffusion of metal into the surrounding dielectric of the layer 102 and/or to impart the required adhesion strength to the metal region 103. A corresponding conductive barrier layer 104 is preferably to be provided in combination with copper or copper-based alloys, since copper may readily diffuse in a plurality of dielectric materials such as silicon dioxide and low-k dielectrics. The conductive barrier layer 104 may be comprised of two or more sub-layers so as to meet the requirements with respect to diffusion mitigating and adhesion characteristics.

A dielectric cap layer 107 is formed over the dielectric layer 102 and the metal region 103, thereby forming an interface 105A with the first surface portion 105. The cap layer 107 may be comprised of an appropriate material that, in the first place, effectively suppresses the diffusion of the metal of the metal region 103 into adjacent device regions, for instance further metallization layers that are still to be formed on top of the cap layer 107. Moreover, the cap layer 107 may additionally act as an etch stop layer in a subsequent patterning process for forming vias connecting to overlying metallization layers still to be formed. The cap layer 107 may be comprised of two or more sub-layers so as to meet the various requirements with respect to the diffusion blocking capability and etch selectivity, and the like. In some embodiments, the cap layer 107 may substantially be comprised of silicon nitride that exhibits an excellent diffusion mitigating effect with respect to a plurality of materials, including copper and copper-based alloys. Moreover, etch recipes exhibiting a moderate selectivity with respect to silicon dioxide are well-known and well-established in the art so that silicon nitride is frequently used in combination with silicon dioxide for the formation of metallization layers. In other cases, when the permittivity of the dielectric separating the individual metal lines and metal regions are of relevance, materials on the basis of silicon carbide may be used for forming the cap layer 107. In some embodiments, the provision of different materials along the thickness of the cap layer 107 may be considered appropriate or the material composition may be varied so as to obtain different characteristics at the first surface portion 105 compared to the exposed surface 107A of the cap layer 107. A thickness of the cap layer 107 may depend on the characteristics, i.e., on the material composition and/or the formation technique for forming the cap layer 107, and may range in some embodiments between approximately 10–70 nm.

A typical process flow for forming the semiconductor device 100 as shown in FIG. 1a may comprise the following processes. After providing the substrate 101, which may include the formation of various circuit elements in conformity with well-established manufacturing processes, the dielectric layer 102 is formed above the substrate 101 by well-established processes that are selected in accordance with the specifics of the dielectric layer 102. For instance, the dielectric layer 102 may be comprised of a silicon dioxide/silicon nitride layer stack with a thin silicon nitride layer (not shown) followed by a thick silicon dioxide layer, wherein these layers may be deposited by well-established plasma enhanced chemical vapor deposition (CVD) techniques with a required thickness, wherein the silicon nitride layer may serve as an etch stop layer in a subsequent patterning process. In other embodiments, the dielectric layer 102 may be formed by spin-on techniques when the dielectric layer 102 is substantially comprised of a low-K polymer material.

Thereafter, the opening in the dielectric layer 102 is formed by advanced photolithography and anisotropic etch techniques, wherein, as previously explained, a corresponding etch stop layer may assist in reliably stopping the anisotropic etch process on or in the etch stop layer that may subsequently be opened at dedicated regions to form connections to circuit elements contained in the substrate 101. Next, the conductive barrier layer 104 may be deposited by advanced physical vapor deposition (PVD), chemical vapor deposition, atomic layer deposition, and the like. For instance, when copper is used, a tantalum/tantalum nitride bi-layer may be formed with a thickness in the range of approximately 5–50 nm. Depending on the deposition process for depositing the metal of the metal region 103, a seed layer (not shown) may be deposited on the conductive barrier layer 104 so as to promote metal deposition in a subsequent plating process. For instance, if copper is to be deposited by electroplating, a thin copper seed layer may be deposited by sputter deposition. Thereafter, a metal layer, for instance comprised of copper, copper alloys, and the like, may be deposited, for instance by electroplating, electrodeless plating, and the like, so as to reliably fill the opening in the dielectric layer 102.

Typically, during the deposition process, excess metal has to be deposited so as to reliably fill the opening, wherein the metal residues have to then be removed by, for instance, chemical mechanical polishing (CMP) and/or electrochemical etching and/or chemical etching. Corresponding processes for removing excess metal from the dielectric layer 102 are well established in the art. By removing the excess metal, the metal region 103 is formed with its final size, wherein the first surface portion 105 is exposed by the removal process. Next, the cap layer 107 may be formed, wherein respective clean processes may be performed prior to the formation of the cap layer 107, especially if the metal-containing region 103 is comprised of copper or copper-based alloys, since the surface portion 105 readily reacts with the ambient or any reactive components that are still left on the surface portion 105 after the removal process. Even during the removal of excess metal, the exposed surface portion 105 may react with reactive ingredients of the CMP and/or the etch process, or may simply oxidize upon contact with the ambient atmosphere during the CMP process. Copper especially tends to form discoloration and erosion on the exposed surface portion 105, which therefore requires a clean process for substantially removing any undesired discolored and/or oxidized portions. Typically, the deposition process for forming the cap layer 107 is combined with a preceding clean process so that the cleaned surface portion 105 may immediately be covered by the cap layer 107, thereby passivating the surface portion 105 and reducing or preventing the re-formation of oxidized portions during further manufacturing steps. The cap layer 107 may be formed by plasma enhanced chemical vapor deposition from appropriate pre-cursor materials so as to obtain the required material composition of the cap layer 107. As previously noted, the composition of the deposition atmosphere may be varied so as to correspondingly vary the material composition in order to meet the requirements with respect to the diffusion blocking capability and/or etch selectivity of the cap layer 107. In other embodiments, the cap layer 107 may be formed in two or more distinguished deposition steps, as will be described in more detail with reference to FIG. 1c.

After the formation of the cap layer 107, an implantation process, denoted as 108, is performed so as to modify the characteristics of the metal region 103 in the vicinity of the first surface portion 105. The implantation 108 may be performed with any appropriate material that enables a significant reduction of the diffusion rate of the material of the metal region 103 along the interface 105A defined by the surface portion 105 and the cap layer 107. For instance, tiny vacancies may be formed in the surface portion 105 during the formation of the cap layer 107, which may provide a path of intense material transport and thus electromigration upon application of a high current density. By implanting a corresponding material into the metal region 103, these tiny vacancies may, at least partially, be filled and thus effectively block the diffusion paths. Moreover, it is believed that any grain boundaries of the metal region 103, such as copper grain boundaries, may serve as diffusion paths, which may also effectively be blocked upon implantation of a respective material. Additionally, the ion bombardment of the implantation 108 may effectively destroy the grain structure at the vicinity of the surface portion 105 by forming a substantially amorphous layer, thereby also reducing the tendency for metal diffusion because grain boundaries are known to be fast diffusion paths. Without limiting the present invention to any of the above explanations, the implantation parameter for the implantation 108, such as the type of material implanted, implantation energy, implantation dose, and the like, may be selected so as to efficiently modify the surface portion 105 to accomplish a reduced electromigration tendency of the metal region 103. These implantation parameters may be obtained by corresponding measurements of the electromigration under specified operating conditions for a plurality of different parameter settings.

The material implanted during the implantation 108 may be any appropriate material that exhibits a reduced diffusion compared to the metal in the region 103 so as to be able to act as a diffusion hindering or diffusion rate reducing material, thereby significantly reducing a metal diffusion along the interface 105A between the surface portion 105 and the cap layer 107. In one particular embodiment, the diffusion-hindering material is selected so as to not unduly change the characteristics of the cap layer 107, since a considerable amount of atoms may remain within the cap layer 107. For instance, if the cap layer 107 is comprised of silicon nitride and/or silicon carbide, suitable candidates for the implant material are silicon, carbon or nitrogen. Using one of these materials may not significantly influence the characteristics of the cap layer 107, that is, the chemical composition and the phase formation thereof. The implantation energy for the implantation 108 may be selected on the basis of the thickness of the cap layer 107 as well as on the material composition of the cap layer 107 and that of the metal region 103 for a selected diffusion-hindering material. A corresponding estimation of the penetration depths, i.e., of the vertical implantation profile within the cap layer 107 and the metal region 103, may be obtained by well-established simulation models.

Figure 2A:
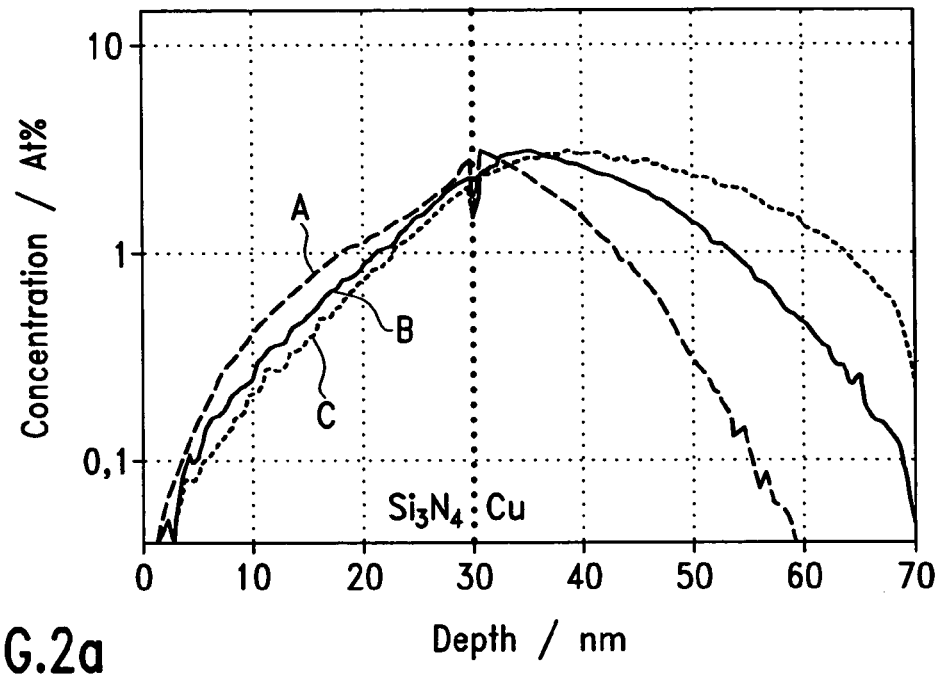
FIGS. 2a and 2b show illustrative examples of a simulation calculation for estimating the concentration of a diffusion hindering or diffusion rate reducing material in the vicinity of an interface between a metal line and a corresponding cap layer in accordance with further illustrative embodiments of the present invention.
Figure 2B:
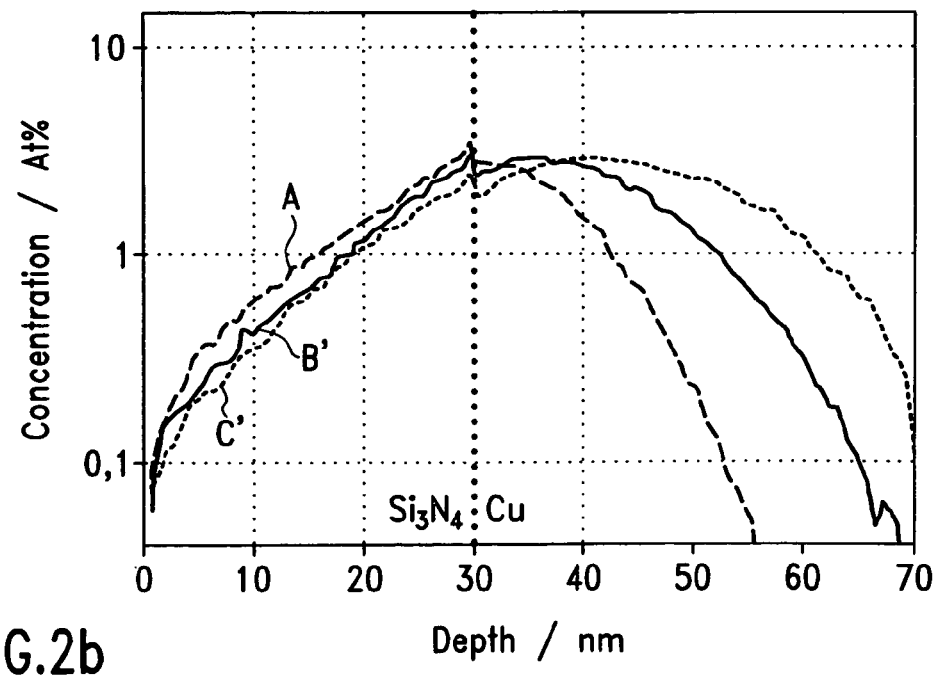

FIGS. 2a and 2b schematically illustrate corresponding calculation results for the implantation 108 with silicon and nitrogen ions, respectively, when the cap layer 107 is comprised of silicon nitride with a thickness of 30 nm and for copper as the material of the metal region 103.

FIG. 2a shows the calculation results for the silicon implantation at implantation energies of 30 keV, 40 keV and 50 keV, which correspond to respective projected penetration depths of 30 nm, 36 nm and 41 nm, respectively. The curve A represents the implantation 108 with an energy of 30 keV, wherein the curve A indicates that a peak concentration of silicon is very close to the interface 105A between the cap layer 107 and the surface portion 105. Thereby, the silicon concentration significantly drops within a distance of approximately 55 nm in the copper. Similarly, the curve B, corresponding to an implantation energy of 40 keV, results in a peak concentration of silicon within the copper at a distance of less than approximately 10 nm, wherein a significant decrease of the silicon concentration within the copper is obtained at approximately 65 nm. The curve C represents the implantation with 50 keV, wherein the peak concentration is located approximately at 10 nm spaced apart from the interface with a significant drop of the silicon concentration at a distance of more than approximately 70 nm.

FIG. 2b schematically shows corresponding curves A', B' and C', referring to implantation energies for nitrogen of 15 keV, 20 keV and 25 keV, respectively corresponding to a projected penetration depth of 28 nm, 34 nm and 39 nm, respectively. FIG. 2b also demonstrates that the implantation energy may appropriately be selected on the basis of the implanted material, the thickness and the composition of the cap layer, and the composition of the metal region 103, so as to locate the peak concentration of the diffusion hindering material closely to the interface 105A between the cap layer 107 and the surface portion 105. The corresponding implantation doses required to obtain the illustrated peak concentrations are also shown in FIGS. 2a and 2b.

In some embodiments of the present invention, the peak concentration for various materials may be varied so as to estimate the diffusion blocking effect of various implanted materials. To this end, a plurality of test substrates may be fabricated and the corresponding degree of electromigration may be determined with respect to the corresponding peak concentration of a plurality of different implanted materials. From these measurement results, corresponding implantation parameters, such as implantation dose and exposure time, may be determined so as to obtain the required diffusion mitigating effect. Similarly, the effect of the implanted concentration of a diffusion hindering or diffusion rate reducing material on the conductivity of the metal region 103 may be investigated in that the concentration and/or the implantation energy is varied for a plurality of materials to determine the effect of different penetration depths and different concentrations on the final electrical resistivity of the metal region 103. On the basis of these measurement results and on the basis of the preceding measurement results that quantify the effects of reducing electromigration with respect to the concentration and type of the diffusion hindering material implanted, the implantation 108 may specifically be designed so as to achieve a desired effect. Moreover, a contamination of the implantation tool, for example with copper, which is a serious issue due to the capability of copper to readily diffuse into sensitive device regions, may effectively be reduced or eliminated since the cap layer 107 may suppress the sputtering off of copper into the process chamber of the implantation tool. At the same time, the cap layer 107 effectively prevents a further reaction of the first surface portion 105 with reactive agents or the ambient atmosphere.

Figure 1B:
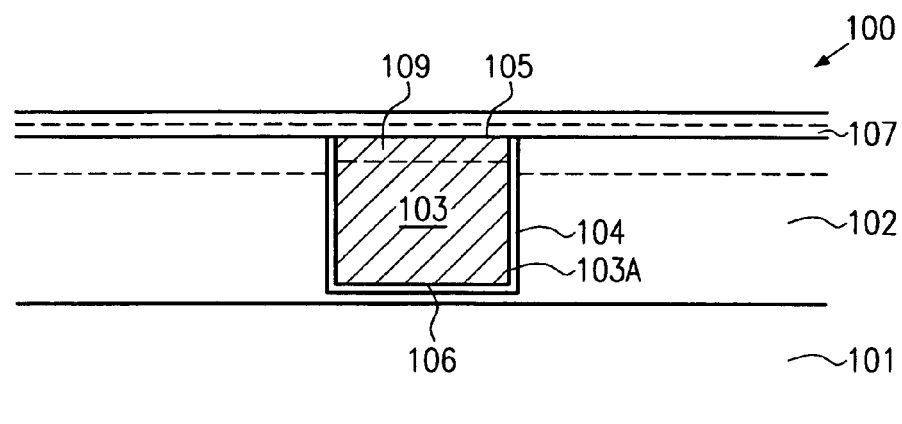

FIG. 1b schematically shows the semiconductor device 100 after completion of the above-described ion implantation 108. Hence, the cap layer 107, the metal region 103, and the dielectric layer 102 comprise portions with a non-negligible amount of a diffusion hindering material, such as silicon, nitrogen, carbon and the like, wherein a vertical extension of the doped portions of these device regions is determined by the implantation 108 and the characteristics of the cap layer 107, the dielectric layer 102, and the metal-containing region 103. As indicated in FIG. 1b, a doped portion 109 of the metal region 103 in the vicinity of the surface portion 105 may differ from a corresponding penetration depth of the dielectric layer 102 owing to the very different materials of these regions. As a consequence of the implantation 108, the region 109 provides modified diffusion characteristics and thus electromigration characteristics in the surface portion 105 and particularly at the interface 105A. Moreover, due to the substantial lack of metal hindering material at the surface portion 106, i.e., at the interface of the metal-containing region 103 to the underlying conductive barrier layer 104, if provided, the metal region 103 is characterized by a high concentration of the diffusion hindering material at the surface portion 105, thereby significantly altering the electromigration behavior, and by a negligible concentration of this material at the surface portion 106, thereby maintaining the conductivity characteristics of the metal region 103 within a dominant portion thereof. In some embodiments, a peak concentration of the diffusion hindering material within the region 109 may be located within a distance of approximately 20 nm with respect to the interface 105A. In other embodiments the peak concentration of the diffusion hindering material within the metal region 103 may be within a distance of approximately 10 nm with respect to the interface 105A formed by the surface portion 105 and the cap layer 107. It should be appreciated that the total peak concentration of diffusion hindering material introduced by the implantation 108 is not necessarily located within the metal region 103, but may be located within the cap layer 107 (curves A' and B' in FIG. 2b).

As previously explained, it may be considered advantageous in some embodiments to not unduly influence the characteristics of the cap layer 107 by the implantation 108 in that compatible materials are implanted. In other embodiments, however, the type of material implanted by the implantation 108 may be selected so as to intentionally impart desired characteristics to the cap layer 107, or alter the behavior of the cap layer 107 in a desired manner. For instance, it may be desirable to provide an increased amount of nitrogen in the vicinity of the surface portion 105 so as to enhance, for example, the diffusion blocking effect of the cap layer 107, irrespective of the initial composition of the cap layer 107. Hence, the implantation parameters may be selected such that a corresponding alteration of the cap layer 107 is obtained, while nevertheless the characteristics of the metal region 103 within the portion 109 are sufficiently modified so as to obtain the desired increased resistance against electromigration.

In other embodiments, the cap layer 107 or a portion thereof may be removed after the implantation 108 if the implantation-induced damage is considered inappropriate for the characteristics of the cap layer 107 for the further processing of the semiconductor device 100. After removal of the cap layer 107, either partially or completely, the cap layer may be re-deposited with a thickness as required, wherein the characteristics of the newly deposited layer or layer portion are not affected by the previously performed implantation 108. For instance, heavy ion species may be used during the implantation 108, such as germanium, xenon, argon and the like, which may effectively modify the characteristics of the metal region 103 within the portion 109 having an extension of less than 10 nm, while at the same time, however, considerably damaging the cap layer 107. In other embodiments, metal ions, for instance tantalum, titanium and the like, may be implanted into the region 103, which may be considered inappropriate for the dielectric layer 107, and therefore a portion or substantially all of the layer 107 may be removed and may be replaced by a newly deposited cap layer. The removal may be accomplished by CMP and/or by reactive ion etching.

Figure 1C:
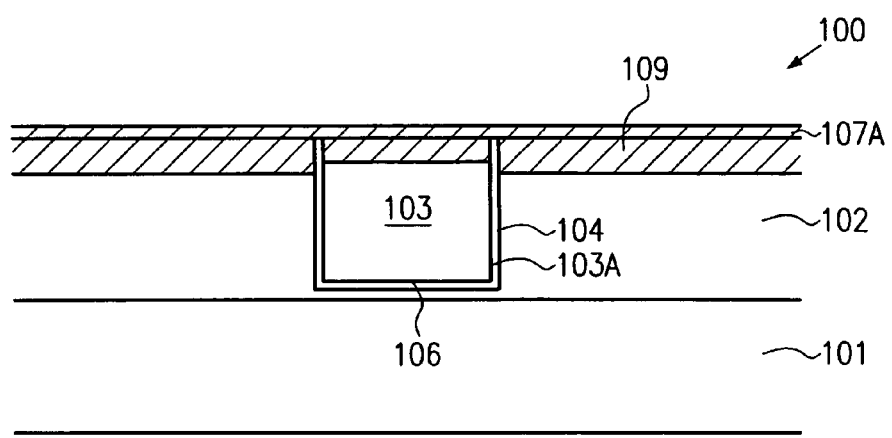

FIG. 1c schematically shows the semiconductor device 100 in accordance with a further illustrative embodiment of the present invention. The device 100 is similar to the device as shown in FIG. 1b, wherein a cap layer 107B is provided with a significantly reduced thickness. The reduced thickness of the cap layer 107B may be selected so as to substantially prevent oxidation of the surface portion 105 during and after the implantation 108 and also to substantially avoid contamination of the implantation tool during the implantation 108. The implantation parameters for creating the doped region 109 may be correspondingly adapted to the reduced thickness of the cap layer 107B. After the implantation 108 (see FIG. 1a), the deposition process for forming the cap layer may be resumed so as to obtain the desired final thickness.

Figure 1D:
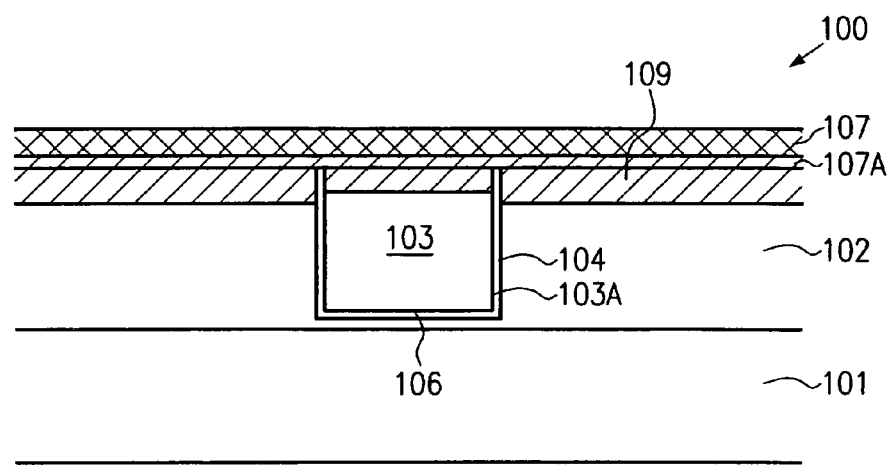

FIG. 1d schematically shows the semiconductor device 100 with the cap layer 107 having the desired thickness and the desired material composition. As is evident from FIG. 1d, merely the portion 107B has experienced the implantation 108, while the remaining part of the cap layer 107 does not exhibit any implantation-induced damage.

As a result, the present invention provides a technique that enables the formation of a cap layer on top of a metal region, wherein the characteristics of the metal region are modified at the vicinity of the interface between the cap layer and the metal region so as to exhibit improved characteristics with respect to electromigration. The modification is accomplished by an implantation process through a cap layer or at least a portion thereof so as to substantially avoid a surface reaction of the metal region with reactive agents or the ambient atmosphere, while at the same substantially avoiding a contamination of the implantation tool by material from the metal region. The implantation process may result in the filling of vacancies, thereby resulting in an effective blocking of grain boundaries. Moreover, an improved castellation of the metal material with the cap layer may be obtained.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a metal region above a substrate, said metal region comprising a first surface portion and a second surface portion opposite to said first surface portion;

forming a cap layer on said first surface portion;

implanting a diffusion rate reducing material into said metal region; and removing at least a portion of said cap layer after the implantation of said diffusion rate reducing material.

2. The method of claim 1, further comprising adjusting implantation parameters on the basis of a material composition of said metal region and said cap layer and on the basis of a thickness of said cap layer so as to locate a peak concentration within said metal region of said diffusion rate reducing material within approximately 20 nm of an interface formed by said first surface portion and said cap layer.

3. The method of claim 2, wherein said implantation parameters are selected so as to locate said peak concentration within a distance of approximately 10 nm from said interface.

4. The method of claim 1, wherein said metal region comprises copper.

5. The method of claim 1, further comprising forming a second cap layer on said cap layer after the implantation of said diffusion rate reducing material.

6. The method of claim 1, further comprising forming a second cap layer after removal of at least a portion of said cap layer.

7. The method of claim 1, wherein said diffusion rate reducing material is a dielectric material.

8. The method of claim 7, wherein said dielectric material comprises a material contained in said cap layer.

9. A method, comprising:

forming a metal region above a substrate, said metal region comprising a first surface portion and a second surface portion opposite to said first surface portion;

forming a cap layer on said first surface portion;

implanting a diffusion rate reducing material into said metal region; and adjusting implantation parameters on the basis of a material composition of said metal region and said cap layer and on the basis of a thickness of said cap layer so as to locate a peak concentration within said metal region of said diffusion rate reducing material within approximately 20 nm of an interface formed by said first surface portion and said cap layer.

10. The method of claim 9, wherein said implantation parameters are selected so as to locate said peak concentration within a distance of approximately 10 nm from said interface.

11. A method, comprising:

forming a metal region above a substrate, said metal region comprising a first surface portion and a second surface portion opposite to said first surface portion;

forming a cap layer on said first surface portion; and implanting a diffusion rate reducing material into said metal region, wherein said diffusion rate reducing material is a dielectric material.

12. The method of claim 11, wherein said dielectric material comprises a material contained in said cap layer.

* * * * *